United States Patent
Ueda

(10) Patent No.: US 8,873,273 B2
(45) Date of Patent: Oct. 28, 2014

(54) SEMICONDUCTOR STORAGE DEVICE AND TEST METHOD THEREOF

(75) Inventor: Yoshihiro Ueda, Yokahama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 355 days.

(21) Appl. No.: 13/409,801

(22) Filed: Mar. 1, 2012

(65) Prior Publication Data

US 2012/0224412 A1 Sep. 6, 2012

(30) Foreign Application Priority Data

Mar. 2, 2011 (JP) .................................. 2011-45166

(51) Int. Cl.
*G11C 11/00* (2006.01)
(52) U.S. Cl.
USPC ........... 365/148; 365/163; 365/158; 365/171; 365/173; 365/210.15; 365/207; 365/210.1
(58) Field of Classification Search
USPC ................. 365/148, 163, 158, 171, 173, 207, 365/210.1, 210.15
See application file for complete search history.

(56) References Cited

U.S. PATENT DOCUMENTS

2010/0046274 A1  2/2010  Tsuchida et al.
2010/0290287 A1*  11/2010  Arussi ...................... 365/185.11
2013/0051122 A1*  2/2013  Mori et al. .................... 365/148

FOREIGN PATENT DOCUMENTS

JP    2010-049730 A2    8/2008

OTHER PUBLICATIONS

U.S. Appl. No. 13/234,587, filed Sep. 16, 2011, Yoshihiro Ueda.
Office Action received in Japanese Patent Application No. 2011-045166, mailed on Jul. 5, 2013, in 3 pages.

* cited by examiner

*Primary Examiner* — Han Yang
(74) *Attorney, Agent, or Firm* — Knobbe, Martens, Olson & Bear LLP

(57) ABSTRACT

A memory includes memory cells each storing data according to a change in a resistance state, and reference cells referred to in order to detect data stored in the memory cells. Sense amplifiers compare reference data in the reference cells with data in the memory cells to detect the data in the memory cells. A counter counts a number $N_H$ of the memory cells having a resistance higher than a resistance of each reference cell or a number $N_L$ of the memory cells having a resistance lower than the resistance of each reference cell based on a result of detecting first logical data stored in the memory cells using each reference cell storing the first logical data. A determining part determines one of the reference cells as an optimum reference cell used in an actual data reading operation based on the number $N_H$ or $N_L$ for the reference cells.

15 Claims, 5 Drawing Sheets

| RC | DOUT | $N_L(0)$ | $N_H(1)$ | $|N_L-N_H|$ | PRIORITY |
|---|---|---|---|---|---|
| RCA | 01110101 | 3 | 5 | 2 | 1 |
| RCB | 11111110 | 1 | 7 | 6 | 3 |
| RCC | 01000001 | 6 | 2 | 4 | 2 |
| RCD | 11111111 | 0 | 8 | 8 | 4 |

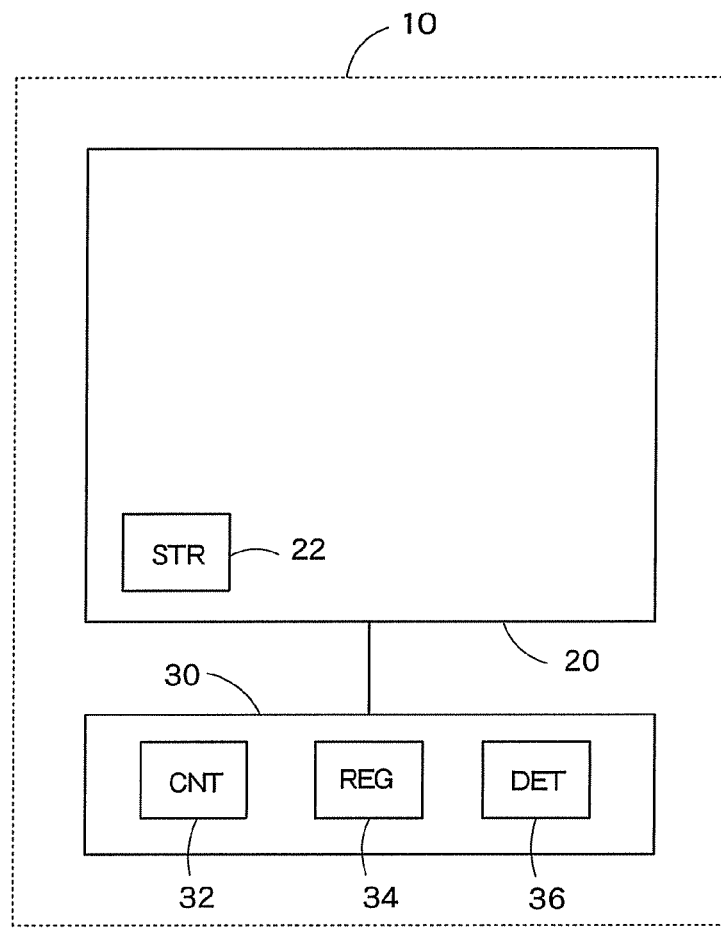
F I G. 1

| RC | DOUT | $N_L(0)$ | $N_H(1)$ | $|N_L-N_H|$ | PRIORITY |
|---|---|---|---|---|---|
| RCA | 01110101 | 3 | 5 | 2 | 1 |
| RCB | 11111110 | 1 | 7 | 6 | 3 |
| RCC | 01000001 | 6 | 2 | 4 | 2 |
| RCD | 11111111 | 0 | 8 | 8 | 4 |

| RCS | DOUT<0:1> | $N_L$ | $N_H$ | $\Sigma (N_L-N_H)^2$ | PRIORITY |
|---|---|---|---|---|---|
| RCA0 | 01110101 | 3 | 5 | 20 | 1 |
| RCA1 | 11010101 | 2 | 6 | | |
| RCB0 | 11111110 | 1 | 7 | 40 | 3 |
| RCB1 | 00000111 | 5 | 3 | | |
| RCC0 | 01000001 | 6 | 2 | 32 | 2 |
| RCC1 | 00011000 | 6 | 2 | | |
| RCD0 | 11111111 | 0 | 8 | 128 | 4 |
| RCD1 | 00000000 | 8 | 0 | | |

F I G. 7

US 8,873,273 B2

SEMICONDUCTOR STORAGE DEVICE AND TEST METHOD THEREOF

CROSS REFERENCE TO RELATED APPLICATIONS

This application is based upon and claims the benefit of priority from the prior Japanese Patent Application No. 2011-45166, filed on Mar. 2, 2011, the entire contents of which are incorporated herein by reference.

FIELD

The embodiments of the present invention relate to a semiconductor storage device and test method thereof.

BACKGROUND

A magnetic random access memory (MRAM) is a type of resistance change memories. As techniques for writing data to an MRAM, there have been known magnetic field writing and spin-transfer torque writing. Among these techniques, the spin-transfer torque writing has advantages in higher integration, lower power consumption, and higher performance because of the property of a spin-transfer torque device that a spin injection current is smaller in an amount for magnetization reversal as magnetic bodies become smaller in size.

However, the read current is minute in the spin-transfer torque device. To quickly sense the difference between such minute currents, a stable reference current between the cell current of a memory cell storing data "0" and that of a memory cell storing data "1" is necessary. For example, when a data reading operation is performed, a read current (a cell current) flows from a sense amplifier to a current sink via a selected memory cell. A reference current flows from the sense amplifier to the current sink via a reference cell. The sense amplifier compares the cell current with the reference current and determines the logical state of data stored in the selected memory cell. Therefore, unless the reference current is near between the cell current of a memory cell storing data "0" and that of a memory cell storing data "1", the sense amplifier may erroneously detect the logical state of the data stored in the selected memory cell.

However, if resistances (that is, currents) of respective reference cells are measured one by one so as to obtain an optimum reference current and to obtain such a reference current, it disadvantageously prolongs the test time, resulting in the increased testing cost of products.

BRIEF DESCRIPTION OF THE DRAWINGS

FIG. 1 is a block diagram showing a memory chip of a magnetic random access memory according to a first embodiment;

FIG. 7 is an explanatory diagram showing a method of determining the reference cells RC in the testing process for an MRAM according to a second embodiment.

DETAILED DESCRIPTION

Figure 2:
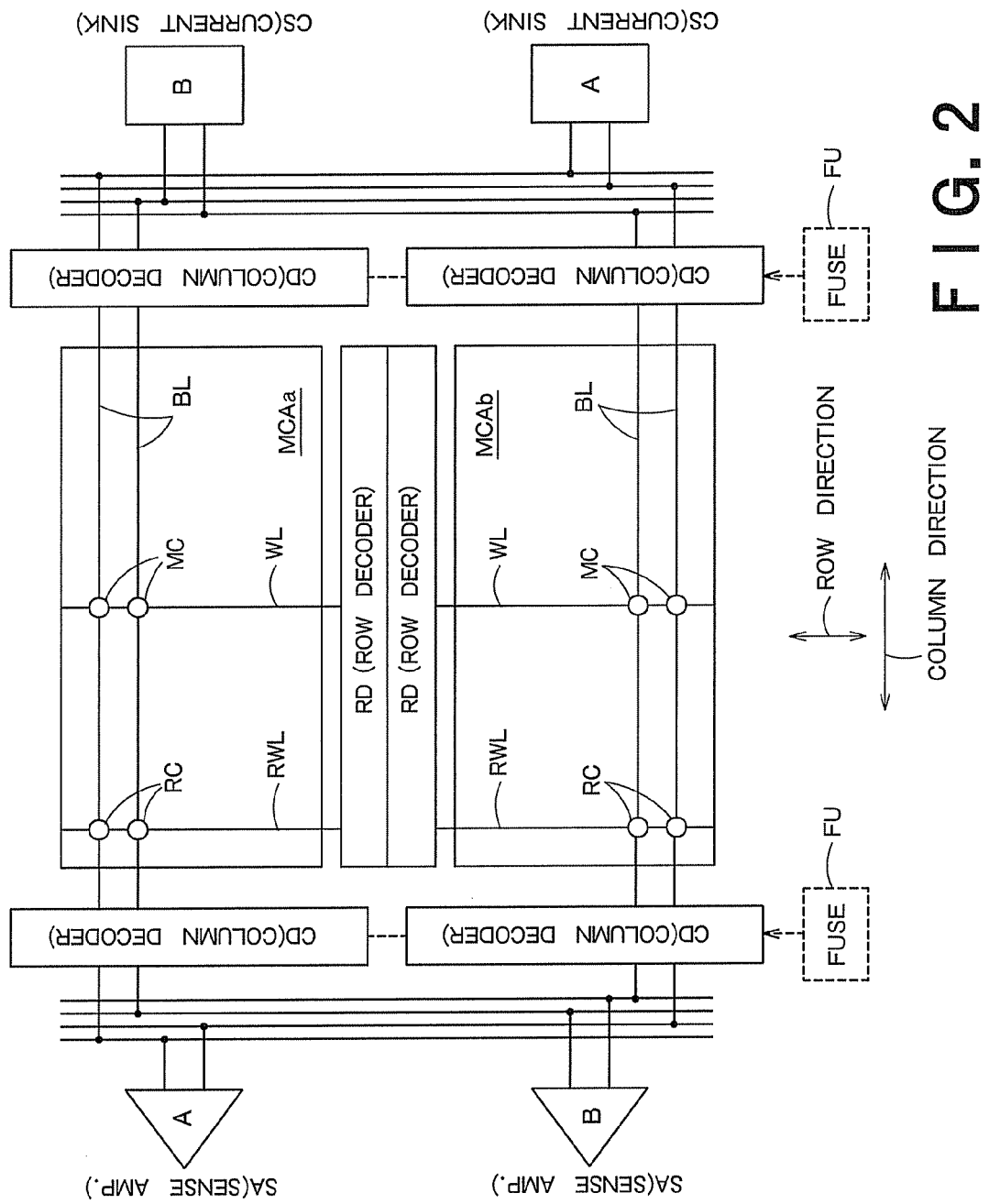
FIG. 2 is a schematic diagram showing an example of a configuration of the memory region 20.

A semiconductor storage device according to the present embodiment comprises a plurality of memory cells each storing data according to a change in a resistance state, and a plurality of reference cells referred to in order to detect data stored in the memory cells. Sense amplifiers are configured to compare reference data stored in the reference cells with data stored in the memory cells in order to detect the data stored in the memory cells. A counter is configured to count a number $N_H$ of the memory cells having a resistance higher than a resistance of each reference cell or a number $N_L$ of the memory cells having a resistance lower than the resistance of each reference cell based on a result of detecting first logical data stored in the memory cells using each reference cell storing the first logical data. A determining part is configured to determine one of the reference cells as an optimum reference cell used in an actual data reading operation based on the number $N_H$ or $N_L$ for the reference cells.

Embodiments will now be explained with reference to the accompanying drawings. The present invention is not limited to the embodiments.

First Embodiment

FIG. 1 is a block diagram showing a memory chip of a magnetic random access memory (hereinafter, "MRAM") according to a first embodiment. The first embodiment is also applicable to a memory using resistance change elements (such as a PCRAM (Phase Change Random Access Memory) or an RRAM (Resistive Random Access Memory)) other than the MRAM).

A memory chip 10 of the MRAM includes a memory region 20 and a test circuit 30.

The memory region 20 includes memory cell arrays MCA and peripheral circuits controlling the memory cell arrays MCA. The memory region 20 also includes a storage part 22 storing reference cell addresses (or reference cell set addresses) for specifying reference cells applied to a plurality of sense amplifiers SA, respectively. As the storage part 22, a part of the memory cell array MCA or a fuse such as a laser fuse, an e-fuse, or a cell fuse can be used.

The test circuit 30 includes a counter 32, a register 34, and a determining part 36. The counter 32 is configured to count a number $N_H$ of memory cells having a resistance higher than that of a reference cell or a number $H_L$ of memory cells having a resistance lower than that of the reference cell. The resistance of the reference cell can be compared with that of each memory cell by detecting a current flowing to each of the reference cell and the memory cell when a predetermined voltage is applied across the reference cell and the memory cell or a voltage applied thereto when a predetermined current is passed through the reference cell and the memory cell.

The register 34 temporarily stores the number $N_H$ and a number $N_L$ of memory cells. The determining part 36 determines optimum reference cells used in an actual data reading operation based on the numbers $N_H$ and $N_L$ of memory cells. The determining part 36 can calculate the numbers $N_H$ and $N_L$ using a logic circuit or calculate these numbers using a CPU and a program. The determination of the optimum reference cells is described later.

FIG. 2 is a schematic diagram showing an example of a configuration of the memory region 20. The MRAM according to the first embodiment includes bit lines BL, word lines WL, memory cells MC, reference cells RC, sense amplifiers SA, current sinks CS, row decoders RD, column decoders CD, and fuses FU. The number of respective constituent elements shown in FIG. 2 is not specifically limited, and these elements can be provided in plural.

The bit lines BL extend in a column direction. The word lines WL extend in a row direction orthogonal to the column direction.

A plurality of memory cells MC and a plurality of reference cells RC are arranged two-dimensionally in a matrix and constitute memory cell arrays MCAa and MCAb (hereinafter, also simply "MCA"). The memory cells MC and reference cells RC are arranged to correspond to intersections between the bit lines BL (or paired bit lines BL) and the word lines WL, respectively. The reference cells RC are provided only for one word line WL (one page) in each of the memory cell arrays MCA. This one word line WL is denoted by RWL in FIG. 2.

As shown in FIG. 2, each of the memory cells MC and the reference cells RC is connected between one bit line BL and one source line SL although FIG. 2 does not show source lines SL. Alternatively, each of the memory cells MC and the reference cells RC can be connected between the two adjacent bit lines BL, that is, paired bit lines BL. In this case, the memory cells MC and the reference memory cells RC are provided to correspond to the intersections between the paired bit lines BL and the word lines WL, respectively.

Each of the row decoders RD is connected to the word lines WL and the reference word line RWL, and configured to selectively drive one word line WL or the reference word line RWL in response to an externally input row address.

Each of the column decoders CD is connected to the bit lines BL and selectively connects one bit line BL to either one sense amplifier SA or the current sink CS.

Each of the sense amplifiers SA is configured to compare reference data stored in one reference cell RC with that stored in one memory cell MC in order to detect a logical state of the data stored in the memory cell MC. More specifically, the sense amplifier SA applies a voltage to the memory cells MC and the reference cell RC via the bit line BL and compares a reference current Iref flowing to the reference cell RC with a cell current Icell flowing to each memory cell MC. The sense amplifier SA detects the logical state of the data stored in the memory cell MC based on the magnitude relation between the cell current Icell and the reference current Iref.

When detecting data, the row decoders RD and the column decoders CD select one of the reference cells RC included in one of the adjacent memory cell arrays MCAa and MCAb and one of the memory cells MC included in the other memory cell array. That is, to detect the data stored in the memory cell MC in the memory cell array MCAa, the reference data is obtained using the reference cell RC in the memory cell array MCAb. On the other hand, in order to detect the data stored in the memory cell MC in the memory cell array MCAb, the reference data is obtained using the reference cell RC in the memory cell array MCAa.

For example, a pair "A" of the sense amplifiers SA and the current sink CS shown in FIG. 2 are connected to both the memory cell arrays MCAa and MCAb, and a pair "B" of the sense amplifiers SA and the current sink CS are connected to both the memory cell arrays MCAa and MCAb. These pairs A and B can thereby detect the data stored in one memory cell MC included in one of the memory cell arrays MCAa and MCAb using one reference cell RC included in the other memory cell array.

Figure 3:
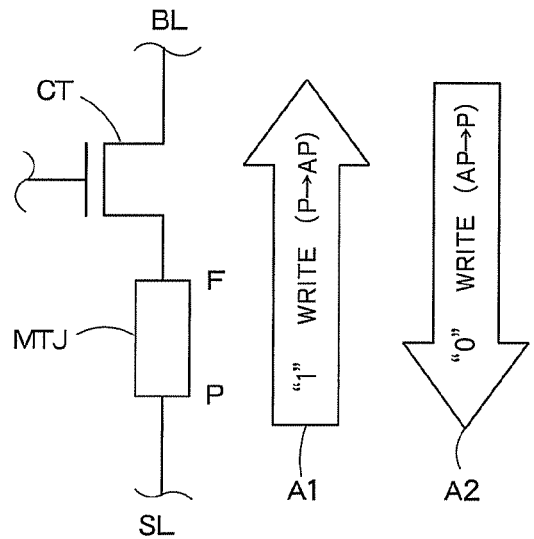
FIG. 3 is an explanatory diagram showing a data writing operation for a single memory cell MC or reference cell RC.

FIG. 3 is an explanatory diagram showing a data writing operation for a single memory cell MC or reference cell RC. Because the reference cell RC is identical in its configuration to the memory cell MC, only the configuration of the memory cell MC is explained here and explanations of that of the reference cell RC will be omitted.

Each of the memory cells MC includes a magnetic tunnel junction (MTJ) element and a cell transistor CT. The MTJ element and the cell transistor CT are connected in series between one bit line BL and one source line SL. In the memory cell MC, the cell transistor CT is arranged near the bit line BL and the MTJ element is arranged near the source line SL. A gate of the cell transistor CT is connected to one word line WL.

The MTJ element that uses the TMR (tunneling magnetoresistive) effect has a stacked structure in which a nonmagnetic layer (tunnel dielectric film) is sandwiched between two ferromagnetic layers. The MTJ element stores digital data according to the change in a magnetic resistance due to the spin-polarized tunneling. The MTJ element can be set in a low resistance state or a high resistance state depending on magnetization orientations of the two ferromagnetic layers. For example, when it is defined that the low resistance state indicates data "0" and that the high resistance state indicates data "1", one-bit data can be recorded in the MTJ element. Needless to say, it can be defined that the low resistance state indicates data "1" and that the high resistance state indicates data "0". For example, the MTJ element is configured to sequentially stack a pinned layer P a tunnel barrier layer, and a recording layer F. The pinned layer P and the recording layer F are made of a ferromagnetic body and the tunnel barrier layer is an insulating film. The pinned layer P has a fixed magnetization orientation, and the recording layer F has a variable magnetization orientation. The MTJ element stores data depending on the magnetization orientation of the recording layer F.

When an electric current flows in an arrow A1 direction at the time of a data writing operation, the magnetization orientation of the recording layer F is anti-parallel to that of the pinned layer P, whereby the MTJ element is in the high resistance state (data "1"). When the electric current flows in an arrow A2 direction during the data writing operation, the magnetization orientation of the recording layer F is parallel to that of the pinned layer P, whereby the MTJ element is in the low resistance state (data "0"). In this way, different data can be written to the MTJ element depending on the direction of the electric current.

Figure 4:
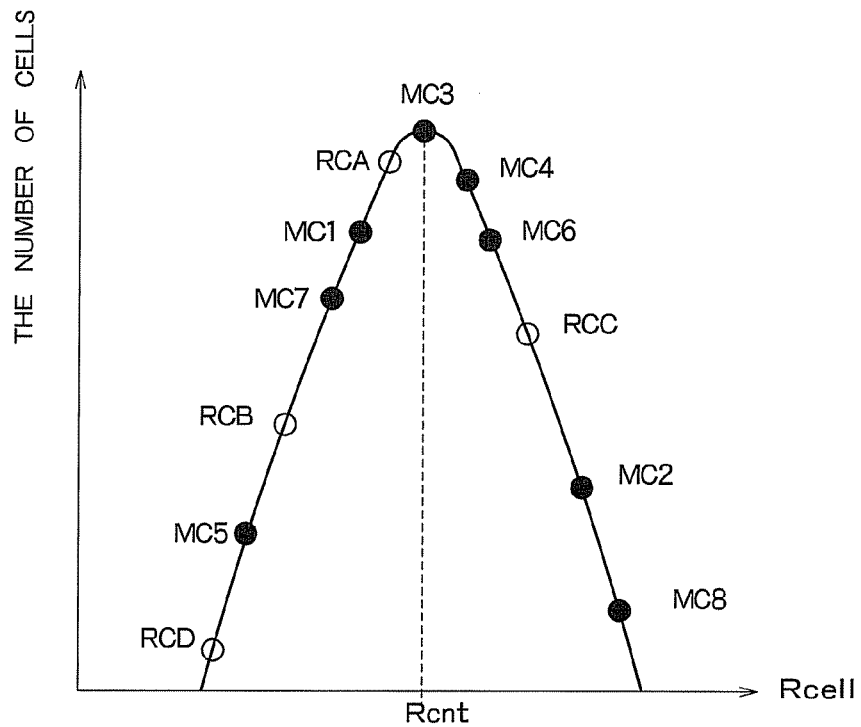
FIGS. 4 and 5 are explanatory diagrams showing a method of determining the reference cells RC in a testing process for the MRAM according to the first embodiment.
Figures 5, 6:
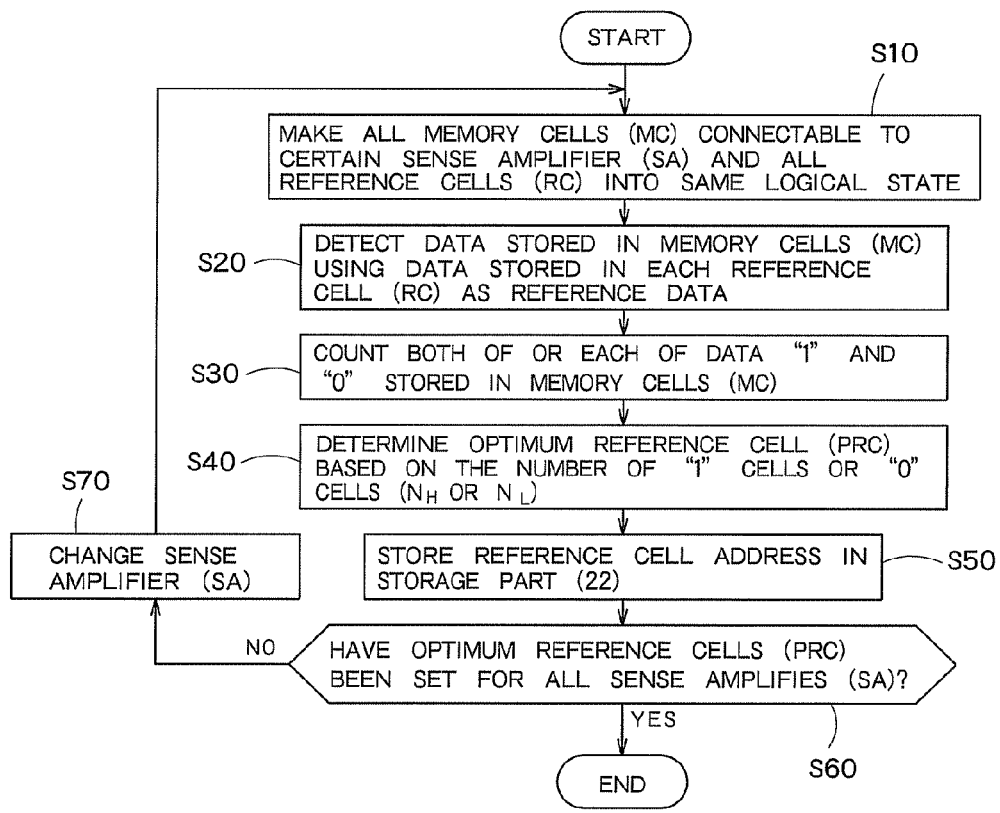
FIG. 6 is a flowchart for explaining the method of determining the reference cells RC in the testing process for the MRAM according to the first embodiment.

FIGS. 4 and 5 are explanatory diagrams showing a method of determining the reference cells RC in a testing process for the MRAM according to the first embodiment. FIG. 6 is a flowchart for explaining the method of determining the reference cells RC in the testing process for the MRAM according to the first embodiment.

The resistances of the memory cells MC are distributed by process irregularities or the like in a manufacturing process even if the memory cells MC store the same logical data. Such a resistance distribution of the memory cells MC is generally according to the normal distribution (see FIG. 4). For this reason, an optimum reference cell PRC is necessary for each of the sense amplifiers SA so that each of the sense amplifiers SA can read the data stored in all the memory cells MC connected to the sense amplifier SA with a certain degree of margin.

The optimum reference cell PRC is the reference cell RC having a resistance closest to a predetermined position on the resistance distribution of the memory cells MC connected to one sense amplifier SA when the memory cells MC store the same logical data. Either a center of the resistance distribution of the memory cells MC or one end of the distribution can be set as this predetermined position. That is, it suffices to set a uniform predetermined position for all the sense amplifiers SA. With this configuration, it suffices to simply shift a gate voltage of each optimum reference cell PRC by a predetermined value in a plurality of sense amplifiers so as to obtain a substantially intermediate current between the currents of the memory cell MC corresponding to both logical data ("0" and "1") as the reference current Iref. In other words, because the optimum reference cells PRC are determined based on the resistance distribution of the actual memory cells MC, the reference current Iref can be simply set to the intermediate current between the cell currents of the memory cells MC storing the data "1" and "0" by uniformly adjusting the gate voltages of the optimum reference cells PRC corresponding to the respective sense amplifiers SA. The testing method of determining the optimum reference cells PRC according to the first embodiment is described below in more detail.

First, all the memory cells MC connectable to a certain sense amplifier SA and all the reference cells RC are made into the same the logical states (S10). To make the memory cells MC and the reference cells RC into the same logical state, it suffices to write the same logical data ("0" or "1") (first logical data) to the memory cells MC and the reference cells RC. Note that the logical state means the state of a memory cell MC in which the resistances of a plurality of memory cells MC form the normal distribution in a certain range.

Next, the sense amplifier SA detects data stored in the memory cells MC using the data stored in the corresponding reference cell RC as the reference data (S20). At this time, the logical state of the reference cell RC is the same as that of the memory cells MC; however, the resistance of the reference cell RC is not completely equal to that of the memory cells MC. To be strict, the cell current Icell always differs from the reference current Iref. Therefore, the sense amplifier SA amplifies the data stored in the memory cells MC to either the data "0" or "1" and detects the amplified data. The sense amplifier SA can hold the detected data in the register 34.

The sense amplifier SA can detect the data stored in all the memory cells MC connected to the sense amplifier SA. In this case, an accurate resistance distribution of all the memory cells MC can be obtained.

Alternatively, the sense amplifier SA can detect the data stored in a predetermined number of memory cells MC among all the memory cells MC connected to the sense amplifier SA. The number of detection target memory cells MC can be set such that the resistance distribution of those memory cells MC becomes the normal distribution. The latter can reduce the test time.

Next, the counter 32 counts both of or one of data "1" and "0" stored in the memory cells MC and detected at Step S20 (S30). In this case, it is defined that the number of data "1" is $N_H$ and that of data "0" is $N_L$. In other words, it is defined that the number of memory cells MC having a resistance higher than that of the reference cell RC is $N_H$, and that the number of memory cells MC having a resistance lower than that of the reference cell RC is $N_L$.

The counter 32 can count both the number $N_H$ of data "1" and the number $N_L$ of data "0"; however, a number $N_T$ of the detection target memory cells MC is known in advance. As long as one of the numbers $N_H$ and $N_L$ is subtracted from the number $N_T$, the other number $N_H$ or $N_L$ can be obtained. Therefore, the counter 32 can count one of the number $N_H$ of data "1" and the number $N_L$ of data "0". The counter 32 can hold both of or one of the numbers $N_H$ and $N_L$ in the register 34.

Steps S10 to S30 are performed for a plurality of reference cells RC, respectively. At this time, Steps S10 to S30 can be performed for all the reference cells RC included in the memory cell arrays MCA so as to obtain the numbers $N_H$ and $N_L$. In this case, the reference cells RC having a resistance closer to the predetermined position on the resistance distribution of the memory cells MC is obtained. However, it suffices to obtain the numbers $N_H$ and $N_L$ by performing Steps S10 to S30 for a predetermined number of reference cells RC among all the reference cells RC included in the memory cell arrays MCA. The latter case can reduce the test time.

The determining part 36 determines the optimum reference cell PRC used in an actual data reading operation among the reference cells RC based on the numbers $N_H$ and $N_L$ (S40).

For example, $MC_1$ to $MC_8$ shown in FIG. 4 denote respective resistances of memory cells $MC_1$ to $MC_8$, and $RC_A$ to $RC_D$ denote respective resistances of reference cells $RC_A$ to $RC_D$. In a graph shown in FIG. 4, the horizontal axis indicates the resistance and the vertical axis indicates the number (frequency).

The determining part 36 determines the reference cell RC having the resistance closest to a central value Rcnt on the resistance distribution of the memory cells MC as the optimum reference cell PRC. As obvious from the graph shown in FIG. 4, the reference cell $RC_A$ closest to the central value Rcnt is suited for the optimum reference cell PRC.

In this case, it suffices that the determining part 36 determines the reference cell RC having the smallest difference ($|N_H-N_L|$) between the numbers $N_H$ and $N_L$ as the optimum reference cell PRC. For example, as shown in FIG. 5, based on detection results DOUT using the respective reference cells RCA to RCD, the counter 32 counts or calculates the number $N_L$ of data "0" and $N_H$ of data "1". The determining part 36 then calculates the differences $|N_H-N_L|$ between $N_L$ and $N_H$. The difference $|N_H-N_L|$ of the reference cell $RC_A$ is 2, that of the reference cell $RC_B$ is 6, that of the reference cell $RC_C$ is 4, and that of the reference cell $RC_D$ is 8. The reference cell $RC_A$ having the smallest difference $|N_H-N_L|$ is estimated to be the closest to the central value Rcnt. Therefore, the determining part 36 sets the reference cell $RC_A$ to be the optimum reference cell PRC.

A plurality of reference cells RC are likely to have the same difference $|N_H-N_L|$. In this case, the determining part 36 can set any one of the reference cells RC having the same difference $|N_H-N_L|$ as the optimum reference cell PRC. Alternatively, Steps S10 to S40 can be performed again by increasing the number of detection target memory cells MC. When the number of detection target memory cells MC is large, the probability that a plurality of reference cells RC have the same difference $|N_H-N_L|$ is considered to decrease.

The determining part 36 can give priorities in the setting of the optimum reference cell PRC to the reference cells RC. For example, in the example shown in FIG. 5, the reference cell $RC_A$ has the highest priority in the setting of the optimum reference cell PRC, followed by the reference cells $RC_C$, $RC_B$, and $RC_D$ in this order. Therefore, if the reference cell $RC_A$ cannot be used, the other reference cells $RC_C$, $RC_B$, and $RC_D$ can be used as the optimum reference cell PRC in order of priority.

Thereafter, an address (a reference cell address) of the reference cell $RC_A$ is stored in the storage part 22 (S50). Because the optimum reference cell PRC is set for every sense amplifier SA, the reference cell address is also set for every sense amplifier SA. Therefore, when the sense amplifier SA for which the optimum reference cell PRC is not set is present (NO at S60), then the sense amplifier SA is changed to another sense amplifier SA (S70), and Steps S10 to S50 are performed again. When Steps S10 to S50 are performed for all the sense amplifiers SA and the optimum reference cells PRC have been set for all the sense amplifiers SA (YES at S60), the determining operation ends. Note that the reference cell RC set as the optimum reference cell PRC does not necessarily differ among the sense amplifiers SA but is occasionally the same.

After ending the test, the gate voltage of each optimum reference cell PRC is shifted to the intermediate current (Iref) between the cell currents of the memory cells MC storing the data "1" and "0" so as to obtain the reference current Iref in an ordinary operation. At this time, it is known that the resistance of the optimum reference cell PRC is closer to the center Rcnt of the resistance distribution. Accordingly, by shifting the gate voltage of the optimum reference cell PRC by the predetermined value, the reference current Iref between the cell currents of the memory cells MC storing the data "1" and "0" flows to the optimum reference cell PRC. The use of such an optimum reference cell PRC enables each sense amplifier SA to read the data stored in all the memory cells MC connected to the sense amplifier SA with a certain degree of margin.

The resistance of the optimum reference cell PRC corresponding to any sense amplifier SA is closer to the center Rcnt of the resistance distribution at a testing stage. Therefore, it suffices to set a shift amount by which the gate voltage of the optimum reference cell PRC is shifted to be equal among all the sense amplifiers SA. This can facilitate the setting of the gate voltage of the reference cells RC.

When each of the sense amplifiers SA detects data during an ordinary data reading operation, the reference current Iref is obtained using the optimum reference cell PRC corresponding to the sense amplifier SA.

According to the first embodiment, the test circuit 30 selects the optimum reference cell PRC for generating the reference current Iref closer to the center Rcnt between the cell current of the memory cell MC storing the data "0" and that of the memory cell MC storing the data "1" for each sense amplifier SA. Each sense amplifier SA can thereby read the data stored in all the memory cells MC connected to the sense amplifier SA with a certain degree of margin.

Furthermore, the test circuit 30 can easily determine this optimum reference cell PRC by calculating the detection results of the memory cells MC and the reference cells RC to which the same logical data is written. Therefore, the first embodiment can determine the optimum reference cells PRC in a short time and reduce the testing cost.

In the first embodiment, the test circuit 30 conducting the test is incorporated in the memory chip 10. By thus incorporating the test circuit 30 in the memory chip 10, the optimum reference cells PRC can be determined quickly. Needless to say, the test circuit 30 can be located outside of the memory chip 10 (for example, in a memory controller).

Second Embodiment

FIG. 7 is an explanatory diagram showing a method of determining the reference cells RC in the testing process for an MRAM according to a second embodiment. In the first embodiment, the determining part 36 determines the optimum reference cells PRC corresponding to the respective sense amplifiers SA. In the second embodiment, in contrast, the determining part 36 simultaneously determines a plurality of optimum reference cells PRC (an optimum reference cell set PRCS) corresponding to a plurality of sense amplifiers SA simultaneously detecting data at the time of a data reading operation. In such a case of the second embodiment, the reference cells RC as many as the sense amplifiers SA driven simultaneously make one set and a plurality of reference cell sets RCS are provided. In the data reading operation, one of the reference cell sets RCS is selected in response to one address. Therefore, in the second embodiment, the determining part 36 determines an optimum reference cell set PRCS from among a plurality of reference cell sets RCS.

The configuration of the second embodiment can be identical to that of the first embodiment. Furthermore, although the operation performed by the MRAM according to the second embodiment differs in the determining method at Step S40 shown in FIG. 6 from that of the first embodiment, in other steps, operations are identical to those of the first embodiment shown in FIG. 6.

FIG. 7 shows a specific example in which each of the reference cell sets RCS includes two reference cells RC. It is assumed that (RCA0, RCA1), (RCB0, RCB1), (RCC0, RCC1), or (RCD0, RCD1) can be allocated to a certain set of two sense amplifiers SA as the reference cell set RCS. That is, at the time of the data reading operation, a plurality of reference cells RC that can be used for a plurality of sense amplifiers SA driven simultaneously constitute the reference cell set RCS for the sense amplifier SA set.

The determining part 36 calculates the square sum ($\Sigma(N_H-N_L)^2$) of the differences ($|N_H-N_L|$) between the numbers $N_H$ and $N_L$ of the reference cells RC included in each of the reference cell sets RCS. For example, the determining part 36 calculates the differences $|N_H-N_L|$ of the reference cells RCA0 and RCA1, respectively for the reference cell set (RCA0, RCA1), and adds up the squares of the differences $|N_H-N_L|$. As a result, the square sum ($\Sigma(N_H-N_L)^2$) of the reference cell set (RCA0, RCA1) is obtained. Similarly, the determining part 36 calculates the square sums ($\Sigma(N_H-N_L)^2$) for the other reference cell sets (RCB0, RCB1), (RCC0, RCC1), and (RCD0, RCD1), respectively.

The determining part 36 determines the reference cell set having the smallest square sum ($\Sigma(N_H-N_L)^2$) as the optimum reference cell set PRCS among the reference cell sets (RCA0, RCA1), (RCB0, RCB1), (RCC0, RCC1), and (RCD0, RCD1).

In the example shown in FIG. 7, the square sum ($\Sigma(N_H-N_L)^2$) of the reference cell set (RCA0, RCA1) is 20, that of the reference cell set (RCB0, RCB1) is 40, that of the reference cell set (RCC0, RCC1) is 32, and that of the reference cell set (RCD0, RCD1) is 128. Therefore, the determining part 36 determines the reference cell set (RCA0, RCA1) as the optimum reference cell set PRCS.

A plurality of reference cell sets RCS are likely to have the same square sum ($\Sigma(N_H-N_L)^2$). In this case, the determining part 36 can set any one of the reference cell sets RCS having the same square sum ($\Sigma(N_H-N_L)^2$) as the optimum reference cell set PRCS. Alternatively, the determining part 36 can make a determination again by increasing the number of sets of detection target memory cells MC. When the number of detection target reference cell sets RCS is large, the probability that a plurality of reference cell sets RCS have the same difference square sum ($\Sigma(N_H-N_L)^2$) is considered to decrease.

The determining part 36 can give priorities in the setting of the optimum reference cell set PRCS to the reference cell sets RCS. For example, in the example shown in FIG. 7, the reference cell set (RCA0, RCA1) has the highest priority in the setting of the optimum reference cell set PRCS, followed by (RCC0, RCC1), (RCB0, RCB1), and (RCD0, RCD1) in this order. Therefore, if the reference cell set (RCA0, RCA1) cannot be used, the other reference cell sets (RCC0, RCC1), (RCB0, RCB1), and (RCD0, RCD1) can be used as the optimum reference cell PRC in order of priority.

Thereafter, at Step S50 in FIG. 6, addresses of the reference cell set (RCA0, RCA1) are stored in the storage part 22. Because the optimum reference cell set PRCS is set for every sense amplifier SA set, the address of the optimum reference cell set PRCS is also set for every sense amplifier SA set. Therefore, Steps S10 to S50 are performed for all the sense amplifier SA sets and the optimum reference cell sets PRCS are set for all the sense amplifier SA sets (see S60). Note that the reference cell set RCS set as the optimum reference cell set PRCS does not necessarily differ among the sense amplifier SA sets but is occasionally the same.

According to the second embodiment, even when the MRAM is configured such that a plurality of sense amplifiers SA are driven simultaneously at the time of a data reading operation and that a plurality of reference cells RC are used simultaneously as the reference cell set RCS, the MRAM can determine the optimum reference set PRCS using the least square method. Furthermore, the second embodiment can also achieve effects identical to those of the first embodiment. While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor storage device comprising:
a plurality of memory cells each storing data according to a change in a resistance state;
a plurality of reference cells referred to in order to detect data stored in the memory cells;
a plurality of sense amplifiers configured to compare reference data stored in the reference cells with data stored in the memory cells in order to detect the data stored in the memory cells;
a counter configured to count a number $N_H$ of the memory cells having a resistance higher than a resistance of each reference cell or a number $N_L$ of the memory cells having a resistance lower than a resistance of each reference cell based on a result of detecting first logical data stored in the memory cells using each reference cell storing the first logical data; and
a determining part configured to determine one of the reference cells as an optimum reference cell used in a data reading operation based on the number $N_H$ or $N_L$ for the reference cells.

2. The device of claim 1, wherein the determining part determines the reference cell, which has a smallest difference ($|N_H-N_L|$) between the numbers $N_H$ and $N_L$, among the reference cells as the optimum reference cell.

3. The device of claim 1, wherein the determining part determines the optimum reference cell for each of the sense amplifiers.

4. The device of claim 2, wherein the determining part determines the optimum reference cell for each of the sense amplifiers.

5. The device of claim 1, further comprising a storage part storing a reference cell address for specifying the optimum reference cell determined by the determining part.

6. The device of claim 2, further comprising a storage part storing a reference cell address for specifying the optimum reference cell determined by the determining part.

7. The device of claim 3, further comprising a storage part storing a reference cell address for specifying the optimum reference cell determined by the determining part.

8. The device of claim 1, wherein
a plurality of the reference cells available to a plurality of the sense amplifiers driven simultaneously at a time of a data reading operation constitute a reference cell set, and
the determining part calculates, for each of a plurality of the reference cell sets, a square sum ($\Sigma(N_H-N_L)^2$) of differences between the numbers $N_H$ and $N_L$ of the reference cells included in each of the reference cell sets, and determines the reference cells included in the reference cell set having a smallest square sum ($\Sigma(N_H-N_L)^2$) as an optimum reference cell set.

9. The device of claim 3, wherein
a plurality of the reference cells available to a plurality of the sense amplifiers driven simultaneously constitute a reference cell set at a time of a data reading operation, and
the determining part calculates, for each of a plurality of the reference cell sets, a square sum ($\Sigma(N_H-N_L)^2$) of differences between the numbers $N_H$ and $N_L$ of the reference cells included in each of the reference cell sets, and determines the reference cells included in the reference cell set having a smallest square sum ($\Sigma(N_H-N_L)^2$) as an optimum reference cell set.

10. The device of claim 5, wherein
a plurality of the reference cells available to a plurality of the sense amplifiers driven simultaneously constitute a reference cell set at a time of a data reading operation, and
the determining part calculates, for each of a plurality of the reference cell sets, a square sum ($\Sigma(N_H-N_L)^2$) of differences between the numbers $N_H$ and $N_L$ of the reference cells included in each of the reference cell sets, and determines the reference cells included in the reference cell set having a smallest square sum ($\Sigma(N_H-N_L)^2$) as an optimum reference cell set.

11. A test method of a semiconductor storage device, the semiconductor storage device comprising:
a plurality of memory cells each storing data according to a change in a resistance state;
a plurality of reference cells referred to in order to detect data stored in the memory cells;
a plurality of sense amplifiers configured to compare reference data stored in the reference cells with data stored in the memory cells in order to detect the data stored in the memory cell;
a counter configured to count number of the memory cells; and
a determining part configured to determine an optimum reference cell used in an actual data reading operation based on the counted number,
the method comprising:
writing same logical data to the memory cells and the reference cells;
detecting data stored in the memory cells and data stored in the reference cells;
counting a number $N_H$ of the memory cells having a resistance higher than a resistance of each reference cell or a number $N_L$ of the memory cells having a resistance lower than the resistance of each reference cell; and
determining one of the reference cells as an optimum reference cell used in a data reading operation based on the number $N_H$ or $N_L$ for the reference cells.

12. The method of claim 11, wherein in the determining of the optimum reference cell, the reference cell, which has a smallest difference ($|N_H-N_L|$) between the numbers $N_H$ and $N_L$, among the reference cells is determined as the optimum reference cell.

13. The method of claim 11, wherein the optimum reference cell is determined for each of the sense amplifiers.

14. The method of claim 12, wherein the optimum reference cell is determined for each of the sense amplifiers.

15. The method of claim 11, wherein
a plurality of the reference cells available to a plurality of the sense amplifiers driven simultaneously at a time of a data reading operation constitute a reference cell set, and
in the determining of the optimum reference cell, a square sum $(\Sigma(N_H-N_L)^2)$ of differences between the numbers $N_H$ and $N_L$ of the reference cells included in each of the reference cell sets is calculated for each of a plurality of reference cell sets, and the reference cells included in the reference cell set having a smallest square sum $(\Sigma(N_H-N_L)^2)$ is determined as an optimum reference cell set.

* * * * *